(12) United States Patent
Tani et al.

(10) Patent No.: US 6,410,363 B1
(45) Date of Patent: *Jun. 25, 2002

(54) SEMICONDUCTOR DEVICE AND METHOD OF MANUFACTURING SAME

(75) Inventors: Takayuki Tani; Takashi Sekibata; Haruo Hyodo, all of Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/543,861

(22) Filed: Apr. 5, 2000

Related U.S. Application Data

(62) Division of application No. 09/036,783, filed on Mar. 19, 1998, now abandoned.

(30) Foreign Application Priority Data

Mar. 10, 1997 (JP) .............................. 9-55166
Nov. 28, 1997 (JP) .............................. 9-327967

(51) Int. Cl.⁷ ...................... H01L 21/44; H01L 21/48; H01L 21/50
(52) U.S. Cl. ................ 438/112; 438/113; 438/114; 438/118; 438/119; 438/127; 438/123; 438/124; 438/125
(58) Field of Search .................. 438/107, 111, 438/112, 113, 114, 118, 119, 123, 124, 125, 146, 127

(56) References Cited

U.S. PATENT DOCUMENTS

| | | | |
|---|---|---|---|
| 4,426,773 A | * 1/1984 | Hargis | 29/832 |
| 5,172,214 A | * 12/1992 | Casto | 257/676 |
| 5,302,849 A | 4/1994 | Cavasin | |
| 5,428,248 A | 6/1995 | Cha | |
| 5,519,251 A | 5/1996 | Sato et al. | |
| 5,656,550 A | * 8/1997 | Tsuji et al. | 438/132 |
| 5,832,600 A | * 11/1998 | Hashimoto | 29/841 |
| 5,861,668 A | 1/1999 | Cha | |
| 5,900,676 A | * 5/1999 | Kweon et al. | 257/787 |
| 5,942,794 A | 8/1999 | Okumura et al. | |
| 6,080,602 A | * 6/2000 | Tani et al. | 438/114 |
| 6,187,614 B1 | * 2/2001 | Takata et al. | 438/112 |

FOREIGN PATENT DOCUMENTS

| | | |
|---|---|---|
| JP | 3-248551 | 11/1991 |
| JP | 6-338504 | 12/1994 |
| JP | 7-38334 | 2/1995 |

* cited by examiner

Primary Examiner—Eddie Lee
Assistant Examiner—Paul E. Brock, II
(74) Attorney, Agent, or Firm—Wenderoth, Lind & Ponack, L.L.P.

(57) ABSTRACT

A lead frame has an array of mounting portions connected by joint bars, and each of the mounting portions has an island serving as an external connection terminal and a plurality of lead terminals extending from the island and serving as external connection terminals for a semiconductor chip to be mounted on an adjacent island along the array. An electrically conductive paste is applied to the island, and a semiconductor chip is mounted on the island. Then, the semiconductor chip is electrically connected to the lead terminals by wires. A resin layer is deposited over the semiconductor chip, a principal surface of the island, and principle surfaces the lead terminals, while leaving opposite surfaces of the island and the lead terminals exposed. A region surrounding the island and the lead terminals electrically connected to the island is cut off into a package.

8 Claims, 13 Drawing Sheets

F I G. 1 1 A
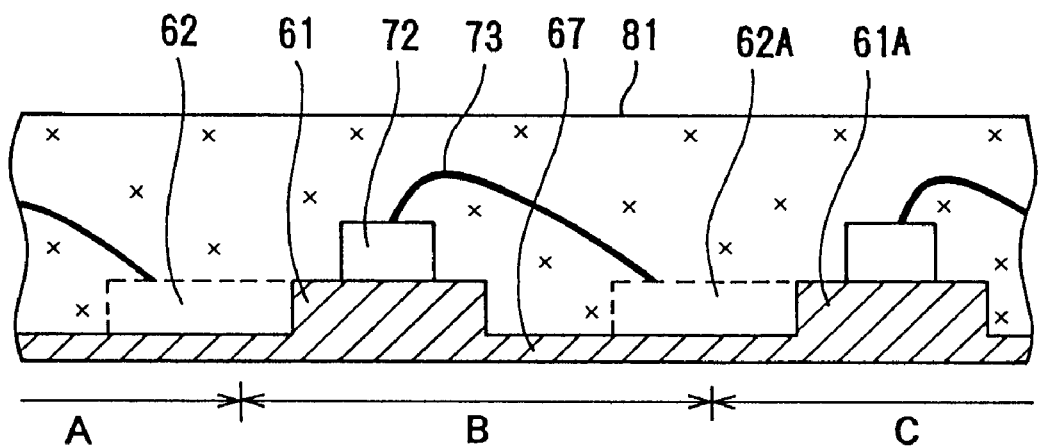
F I G. 1 1 B
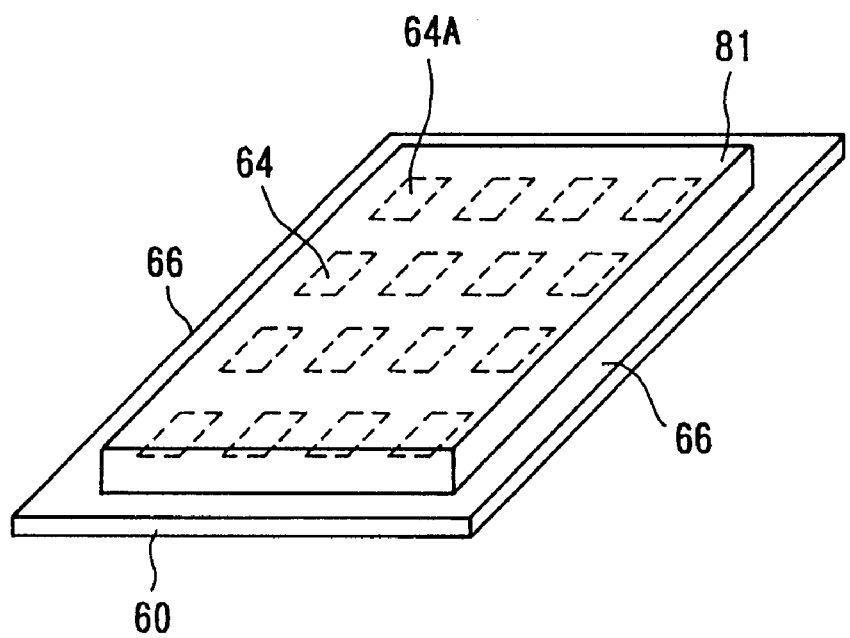

F I G. 13A
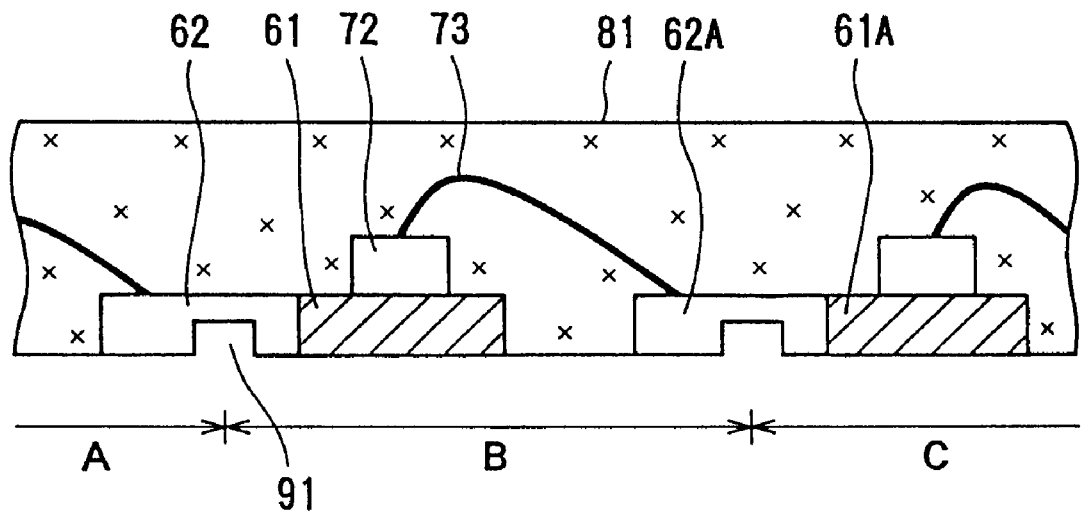
F I G. 13B
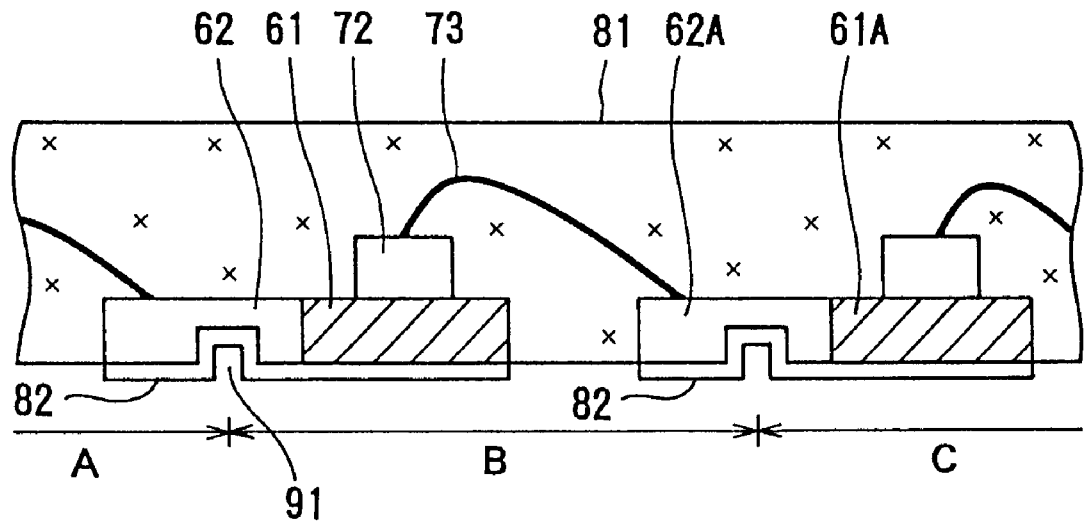

SEMICONDUCTOR DEVICE AND METHOD OF MANUFACTURING SAME

This application is a Divisional Application of Ser. No. 09/036,783 now abandoned.

BACKGROUND OF THE INVENTION

1. Field of the Invention

The present invention relates to a semiconductor device and a method of manufacturing such a semiconductor device, and more particularly to a semiconductor device having an increased effective mount area percentage which represents a ratio between the chip area of the semiconductor device and the area in which the semiconductor device is mounted on a packaging board such as a printed-circuit board or the like, and a method of manufacturing such a semiconductor device.

2. Description of the Prior Art

Generally, a semiconductor device comprising a transistor element fabricated on a silicon substrate is mainly of a structure as shown in FIG. 1A of the accompanying drawings.

As shown in FIG. 1A, a semiconductor device comprises a silicon substrate 1, an island 2 such as a heat-radiating plate or the like on which the silicon substrate 1 is mounted, lead terminals 3, and a molded resin body 4 by which the silicon substrate 1, the island 2, and the lead terminals 3 are encased.

The silicon substrate 1 is fixed to the island 2, which is made of a copper-based material, by a joining material 5 such as a soldering material. A semiconductor element formed on the silicon substrate 1 has base and emitter electrodes electrically connected to the lead terminals 3 by wires 6 according to a wire bonding process. The semiconductor element has a collector electrode electrically connected to a lead terminal that is integral with the island 2. After the silicon substrate 1 is mounted on the island 2 and the semiconductor element is electrically connected to the lead terminals, the assembly is encased by the molded resin body 4, which is made of a thermosetting resin such as an epoxy resin or the like, according to a transfer molding process, thereby producing a three-terminal semiconductor device in which the silicon substrate 1 and portions of the lead terminals 3 are fully covered with the molded resin body 4.

As shown in FIG. 1B of the accompanying drawings, the transfer molding process is carried out by a molding assembly including upper and lower molds 7, 8 which jointly define a mold cavity 9. A lead frame 10 on which the silicon substrate 1 and the wires 6 are mounted by die bonding and wire bonding is placed in the mold cavity 9, and then the thermosetting resin is introduced into the mold cavity 9.

The molded semiconductor device is usually mounted on a packaging board such as a glass epoxy board or the like, and electrically connected to other semiconductor devices and circuit elements on the packaging board. The semiconductor device thus connected will operate as a component in an electronic circuit.

FIG. 2 of the accompanying drawings shows a semiconductor device mounted on a packaging board. As shown in FIG. 2, a semiconductor device 20 is mounted on a packaging board 30 and has base and emitter electrodes connected to lead terminals 21, 23 and a collector terminal connected to a lead terminal 22.

The semiconductor device 20 is mounted on the packaging board 30 in a mount area thereon which is defined as a region surrounded by the lead terminals 21, 22, 23 and electrically conductive pads connected to the lead terminals 21, 22, 23. The mount area is much larger than the area of the silicon substrate (semiconductor chip) in the semiconductor device 20. Most of the mount area is taken up by the molded resin body of the semiconductor device 20 and the lead terminals 21, 22, 23.

A ratio between the area of the semiconductor chip which performs functions of the semiconductor device 20 and the mount area is referred to as an effective area percentage. It has been confirmed that the effective area percentage of resin-molded semiconductor devices is very small. The small effective area percentage means that most of the mount area is a dead space not directly related to the semiconductor chip, and also means that there is a large dead space on the packaging board 30 on which the semiconductor device 20 is connected to the other semiconductor devices and circuit elements. The large dead space poses limitations on efforts to achieve a higher density on the packaging board 30 and make the packaging board 30 smaller in size.

Such problems manifest themselves particularly with semiconductor devices having small package sizes. For example, a semiconductor chip installed in the contour type SC-75A according to the EIAJ standards has a maximum size of 0.40 mm×0.40 mm as shown in FIG. 3 of the accompanying drawings. When the semiconductor chip is connected to metal lead terminals by wires and encased by a molded body, the overall size of the resultant semiconductor device has a size of 1.6 mm×1.6 mm. The chip area of the semiconductor device is 0.16 $mm^2$, and the mount area in which the semiconductor device is mounted is 2.56 $mm^2$, assuming that it is substantially the same as the area of the semiconductor device. Consequently, the effective area percentage of the semiconductor device is about 6.25%. Therefore, most of the mount area is a dead space not directly related to the area of the semiconductor chip.

The above problems with respect to the effective area percentage are serious if the semiconductor device has a small package size, as described above, and a large chip size. The same problems also occur with respect to resin-molded semiconductor devices in which semiconductor chips are connected to metal lead terminals and encased by molded resin bodies.

Recent electronic devices including portable information processing devices such as personal computers, electronic notepads, etc., 8-mm video cameras, portable telephone sets, cameras, liquid-crystal television sets, etc. have packaging boards which tend to be higher in density and smaller in size as the electronic devices themselves become smaller in size.

As described above, the large dead space contained in the mount area for resin-molded semiconductor devices has posed limitations on the efforts to reduce the size of packaging boards, and hence has prevented packaging boards from being reduced in size.

One conventional proposal for increasing the effective area percentage is disclosed in Japanese laid-open patent publication No. 3-248551. The disclosed arrangement will be described below with reference to FIG. 4 of the accompanying drawings. According to the disclosure, in order to minimize the mount area in which a resin-molded semiconductor device is mounted on a packaging board or the like, lead terminals 41, 42, 43 to which base, emitter, and collector terminals of a semiconductor chip 40 are connected do not project outwardly from sides of a molded resin body 44, but are bent along the sides of the molded resin body 44.

Inasmuch as the distal ends of the lead terminals 41, 42, 43 do not project outwardly, the mount area of the resin-molded semiconductor device is reduced by an area which would otherwise be taken up by the projecting ends of the lead terminals 41, 42, 43, resulting in a slight increase in the effective area percentage.

The distal ends of the lead terminals 41, 42, 43 are bent around corners of the lower surface of the molded resin body 44. Because the lead terminals 41, 42, 43 are required to withstand stresses imposed when they are bent, the lead terminals 41, 42, 43 need to have a sufficiently large length embedded in the molded resin body 44. As a consequence, the size of the molded resin body 44 is much larger than the size of the semiconductor chip 40, and hence the effective area percentage may not substantially be reduced. The lead terminals 41, 42, 43 required to be connected to the semiconductor chip 40 increase the cost of materials used and complicate the fabrication process, with the result the manufacturing cost cannot be lowered.

To maximize the effective area percentage, a semiconductor chip may directly be mounted on a packaging board for equalizing the area of the semiconductor chip and the mount area substantially to each other.

Japanese laid-open patent publication No. 6-338504 discloses a conventional process of mounting a semiconductor chip directly on a board such as a packaging board. According to the disclosed process, as shown in FIG. 5 of the accompanying drawings, a flip chip comprising a plurality of bump electrodes 46 formed on a semiconductor chip 45 is bonded to a packaging board 47 by a face-down bonding process. The disclosed process is used primarily with respect to horizontal semiconductor devices such as MOSFETs or the like in which gate (base), source (emitter), and drain (collector) electrodes are formed on one principal surface of a silicon substrate, with current or voltage paths extending horizontally.

The flip-chip mounting, however, cannot be applied to vertical semiconductor devices such as transistor devices or the like in which a silicon substrate serves as an electrode and electrodes are formed on different surfaces, with current paths extending vertically.

Another conventional process of mounting a semiconductor chip directly on a board such as a packaging board is revealed in Japanese laid-open patent publication No. 7-38334, for example. According to the revealed process, as shown in FIG. 6 of the accompanying drawings, a semiconductor chip 53 is mounted on an electrically conductive pattern 52 on a packaging board 51 by a die bonding process, and the electrically conductive pattern 52 around the semiconductor chip 53 is electrically connected to the semiconductor chip 53 by wires 54. The disclosed process can be applied to semiconductor chips such as vertical transistors in which a silicon substrate serves as an electrode.

The wires 54 which connect the semiconductor chip 53 to the electrically conductive pattern 52 disposed therearound are usually in the form of thin gold wires. In order to increase the peel strength (tensile strength) of bonding areas which are bonded to the thin gold wires, the wires 54 should preferably be bonded in a heating atmosphere in the range of about 200° C. to 300° C. When a semiconductor chip is mounted on a packaging board made of insulating resin by a die bonding process, however, if the assembly is heated to the above temperature range, then the packaging board will be distorted, and the soldering material with which other circuit elements including chip capacitors, chip resistors, etc. mounted on the packaging board will be melted. To avoid such difficulties, it has been customary to mount a semiconductor chip on a packaging board made of insulating resin according to a die bonding process at a temperature ranging from about 100° C. to 150° C. Such a low temperature range tends to reduce the peel strength of the bonding areas.

Since the die-bonded semiconductor chip is covered and protected by the encasing resin such as an epoxy resin or the like, the reduction in the peel strength allows bonded regions to be peeled off due to shrinkage of the epoxy resin upon thermosetting.

The lead frame 10 and the mold cavity 9 (see FIG. 1B) can be positioned relatively to each other with an accuracy limit of ±50 $\mu$. Therefore, the size of the island 2 (see FIG. 1A) should be designed in view of the above positional accuracy limit. The positional accuracy limit reduces the dimensions of the island 2 with respect to the outer dimensions of the package, resulting in limitations on the maximum dimensions of the semiconductor chip 1 that can be accommodated in the package.

SUMMARY OF THE INVENTION

It is therefore an object of the present invention to provide a semiconductor device which has electrodes disposed in one plane for connecting a base, an emitter, and a collector for external connection, and has a maximum effective area percentage which is a ratio between the area of a semiconductor chip and the amount area in which the semiconductor device is mounted on a packaging board, resulting in a minimum dead space in the mount area.

According to the present invention, there is provided a semiconductor device comprising an island with a semiconductor chip mounted thereon, a plurality of lead terminals having ends disposed near the island, a plurality of connectors by which electrode pads on a surface of the semiconductor chip are electrically connected to the lead terminals, and an insulating body encasing the semiconductor chip, the island, the lead terminals, and the connectors, producing a package. The island and the lead terminals are separate from each other, and the package has an outer contour defined by surfaces cut after the insulating body is solidified.

The lead terminals have ends exposed as external connection terminals at one of the surfaces.

According to the present invention, there is also provided a semiconductor device comprising an island with a semiconductor chip mounted thereon, a plurality of lead terminals disposed near the island, a plurality of connecting lines by which electrodes of the semiconductor chip are electrically connected to the lead terminals, and a molded resin body encasing the island, the semiconductor chip, the lead terminals, and the connecting lines, producing a package. The molded resin body has side surfaces defined as cut surfaces, and the island and the lead terminals have surfaces exposed at a reverse side of the molded resin body. The island and the lead terminals have cut surfaces lying flush with the side surfaces of the molded resin body.

According to the present invention, there is further provided a method of manufacturing a semiconductor device, comprising the steps of preparing a lead frame having an island and a plurality of lead terminals having ends disposed near the island, mounting a semiconductor chip on a surface of the island, electrically connecting electrodes on a surface of the semiconductor chip to the lead terminals, encasing the lead frame, the lead terminals, and the semiconductor chip with an insulating body, and cutting the insulating body into a package.

According to the present invention, there is also provided a method of manufacturing a semiconductor device, comprising the steps of preparing a lead frame having an array of frames connected by joint bars, each of the frames having an island serving as an external connection terminal and a plurality of lead terminals extending from the island and serving as external connection terminals for a semiconductor chip to be mounted on an adjacent island along the array, mounting a semiconductor chip on a principal surface of the island, electrically connecting the semiconductor chip to the lead terminals extending from an adjacent island along the array, depositing a resin layer in covering relation to the semiconductor chip, the principal surface of the island, and principal surfaces the lead terminals, while leaving opposite surfaces of the island and the lead terminals exposed, and separating a region surrounding the island and the lead terminals electrically connected to the island into a package.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 11A is a fragmentary cross-sectional view of the lead frame and the semiconductor chips which are encased by a molded resin body;

FIG. 11B is a perspective view of a molded assembly;

FIG. 13A is a fragmentary cross-sectional view of the molded assembly from which a bottom plate is removed;

FIG. 13B is a fragmentary cross-sectional view of the molded assembly on which plated layers are formed;

DETAILED DESCRIPTION OF THE PREFERRED EMBODIMENTS

Figure 1A:
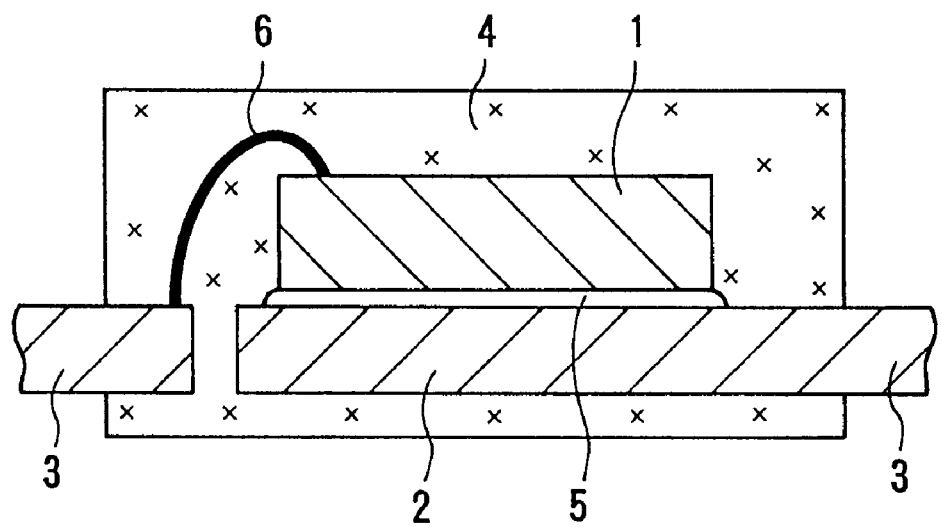
FIG. 1A is a cross-sectional view of a conventional semiconductor device.
Figure 1B:
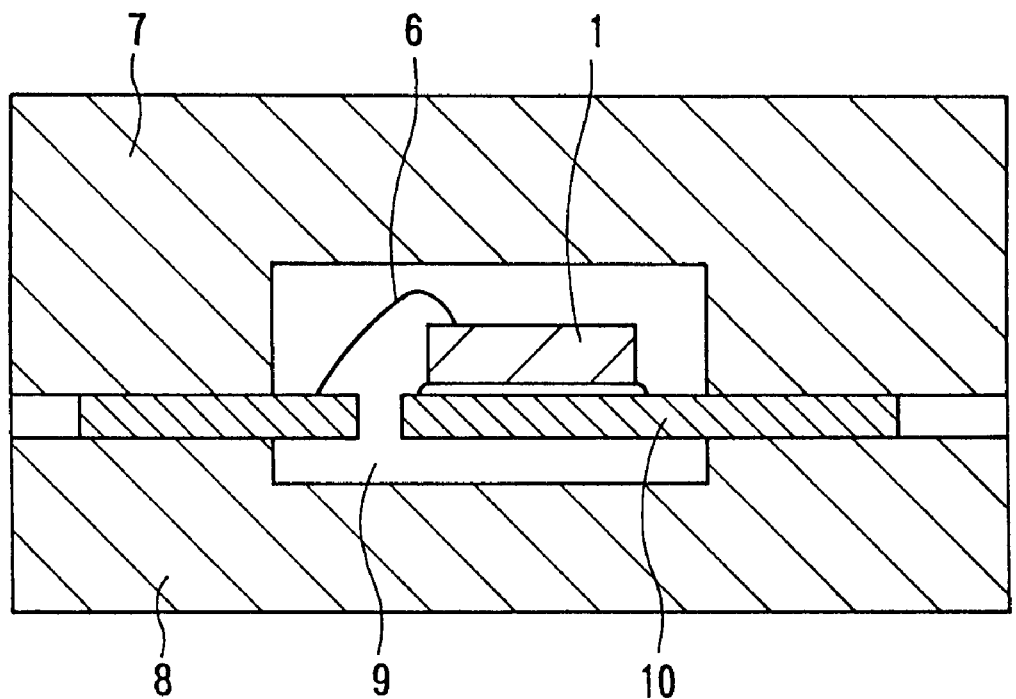
FIG. 1B is a cross-sectional view showing the manner in which the conventional semiconductor device is fabricated according to a transfer molding process.
Figure 2:
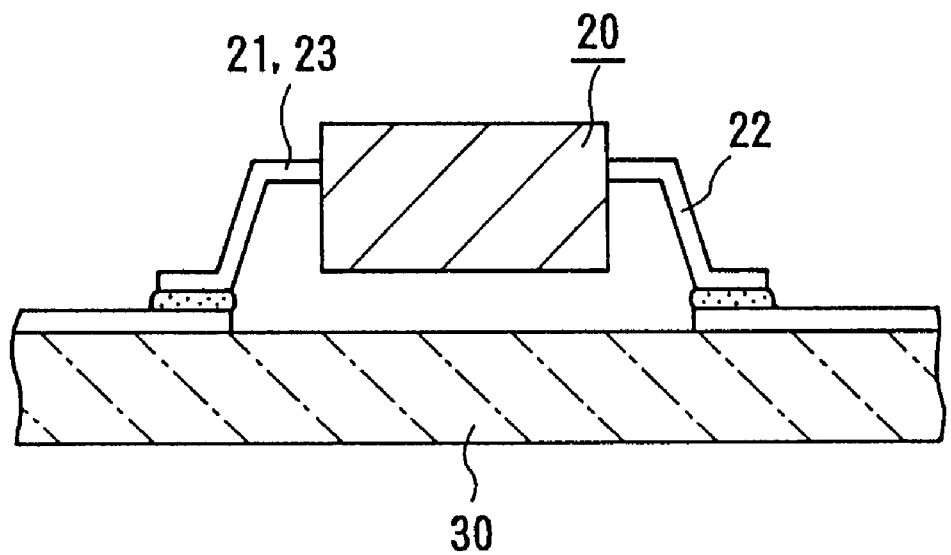
FIG. 2 is a cross-sectional view of another conventional semiconductor device mounted on a packaging board.

As shown in FIGS. 7A–7C and 8A, 8B, a semiconductor device according to the present invention comprises a silicon semiconductor chip 72 including a desired active element and bonded to a principal surface of an island 61 by an electrically conductive adhesive or a eutectic crystal of Au—Si. The island 61 is used as a portion 100 of an electrode for external connection. The semiconductor device also has a plurality of lead terminals 62, 63 spaced from the island 61. Electrode pads on an upper surface of the semiconductor chip 72 are electrically connected to surfaces of the lead terminals 62, 63 by wires 73. The semiconductor chip 72, the wires 73, the island 61, and the lead terminals 62, 63 are encased by a molded resin body 81, providing a package which is substantially in the form of a rectangular parallelepiped. The molded resin body 81 is made of molded thermosetting epoxy resin.

Each of the island 61 and the lead terminals 62, 63 is made of a copper-based metal material having a thickness of about 0.2 mm. The molded resin body 81 has outer dimensions including a width of about 0.7 mm, a length of about 1.0 mm, and a height of about 0.6 mm. The island 61 and the lead terminals 62, 63 have reverse or lower sides exposed on the reverse or lower surface of the molded resin body 81. The exposed reverse or lower sides of the island 61 and the lead terminals 62, 63 are plated with metal layers 82 such as solder-plating layers. The island 61 and the lead terminals 62, 63 serve respectively as external connection terminals 100, 101, 102.

Of the six surfaces of the package in the form of a rectangular parallelepiped, at least an upper surface 81a is formed by a mold which is used to mold the molded resin body 81. Side surfaces 81c, 81d, 81e, 81f of the package are formed by a cutter which is used to cut off the molded resin body 81. The lead terminals 62, 63 have ends exposed at the side surface 81e. The island 61 has a plurality of projecting teeth 61a, 61b whose ends are exposed at the side surfaces 81c, 81d, 81f. The portions of the island 61 and the lead terminals 62, 63 which are exposed at a reverse or lower surface 81b of the package and the side surfaces 81c, 81e are soldered as the external connection terminals 100, 101, 102 to a printed-circuit board. The semiconductor device is thus mounted on the printed-circuit board.

A process of manufacturing the semiconductor device will be described below with reference to FIGS. 9A through 14.

Figure 9A:
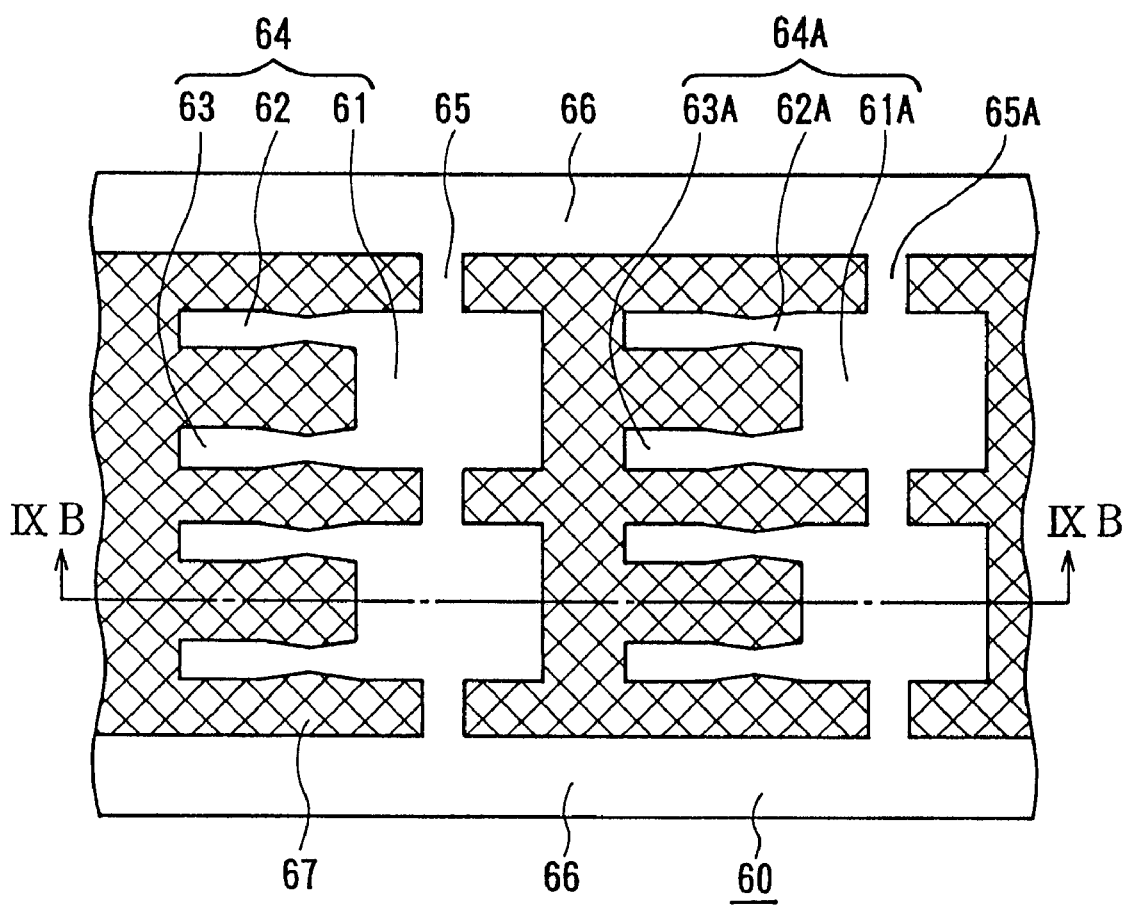
FIG. 9A is a fragmentary plan view of a lead frame used in a process of manufacturing the semiconductor device according to the present invention.
Figure 9B:
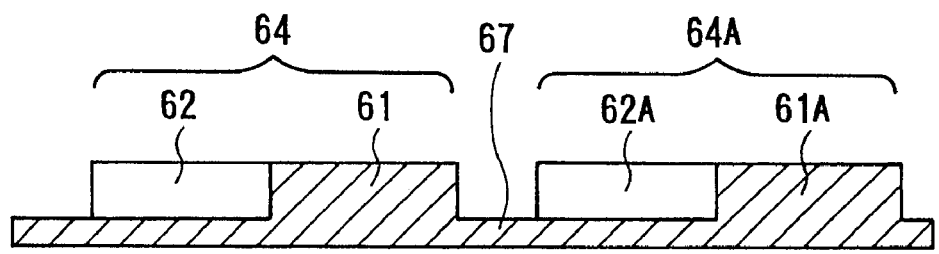
FIG. 9B is a cross-sectional view taken along line IXB—IXB of FIG. 9A.

1st Step (FIGS. 9A and 9B):

A lead frame 60 shown in FIGS. 9A and 9B is prepared. The lead frame 60 comprises a plurality of mounting portions 64 arrayed in a row or column and interconnected by joint bars 65 that are connected to outer strips 66 between which mounting portions 64 are positioned. Each of the mounting portions 64 has an island 61 which serves as a mount for a semiconductor chip and a plurality of lead terminals 62, 63 which extend from the island 61 and which will serve as electrodes for external connection. In FIGS. 9A and 9B, adjacent mounting portions are represented respectively by 64, 64A, and the mounting portion 64A has an island 61A and lead terminals 62A, 63A extending therefrom toward but terminating short of the island 61 of the adjacent mounting portion 64. For example, one elongate lead frame 61 comprises an array of 100 mounting portions 64. Each of the lead terminals 62, 63, 62A, 63A has a constricted central region. The lead frame 60 also has a bottom plate 67 which extends below the mounting portions 64, 64A and are lower than upper surfaces of the islands 61, 61A and the lead terminals 62, 63, 62A, 63A. The bottom plate 67 has a reverse or lower surface which is contiguous to and lies flush with the reverse or lower surfaces of the islands 61, 61A and the lead terminals 62, 63, 62A, 63A.

The lead frame 60 which as the mounting portions 64, 64A and the bottom plate 67 is manufactured as follows: A strip-shaped or elongate rectangular thin metal sheet made of a copper-based metal material having a thickness of about 0.2 mm is prepared, and a hard mask or a photoresist mask which has a pattern complementary to the mounting portions 64, 64A, the joint bars 65, 65A, and the outer strips 65 is formed on a principal surface of the thin metal sheet. Then, the exposed surface of the thin metal sheet which is not covered with the mask is etched to a depth of about 0.15 mm, thereby selectively forming the bottom plate 67 (shown hatched in FIG. 9A) having a thickness of about 0.05 mm around the islands 61, 61A, the lead terminals 62, 63, 62A, 63A, and the joint bars 65. The thickness of the lead frame 60 and the thickness of the bottom plate 67 may be set to desired values. Alternatively, the bottom plate 67 which has a uniform thickness may be prepared separately and bonded to the lead frame 60 which has been formed with the mounting portions 64.

Figure 10A:
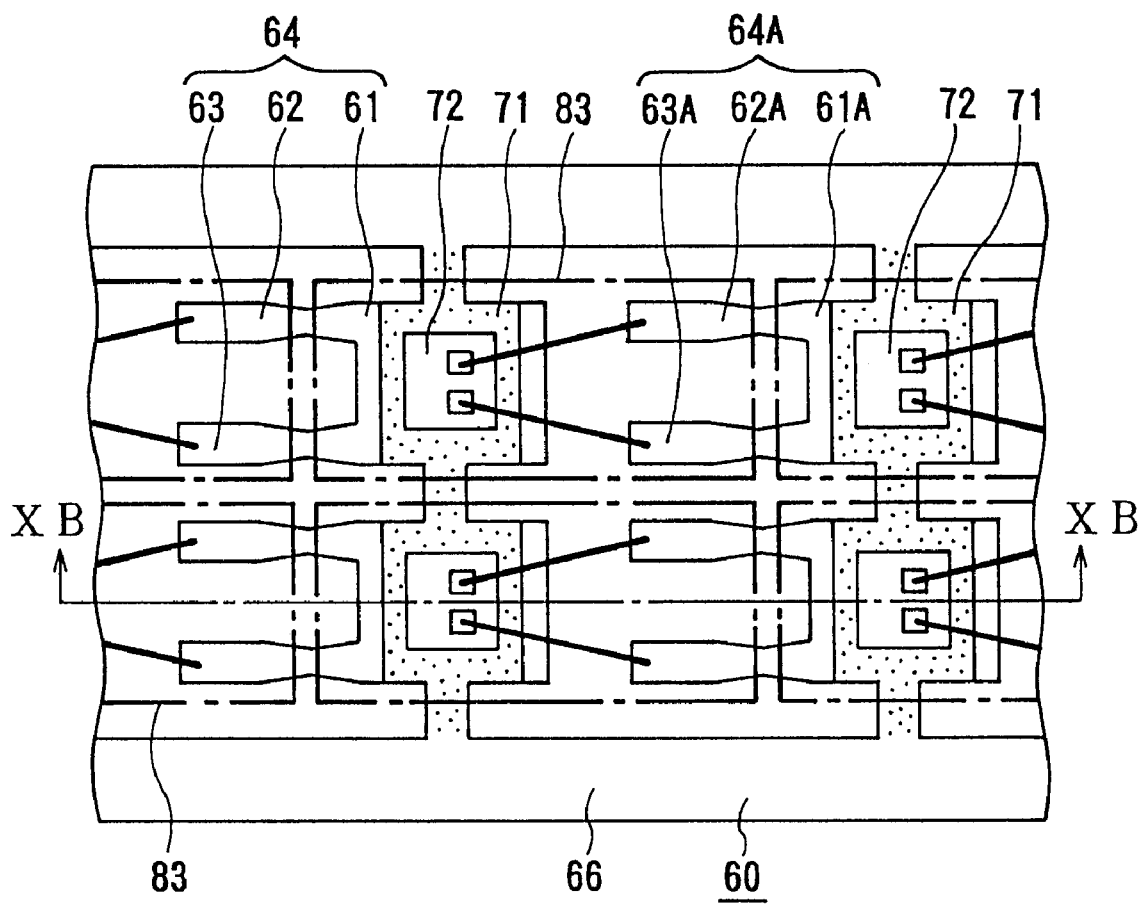
FIG. 10A is a fragmentary plan view of the lead frame on which semiconductor chips are mounted and connected by wires.
Figure 10B:
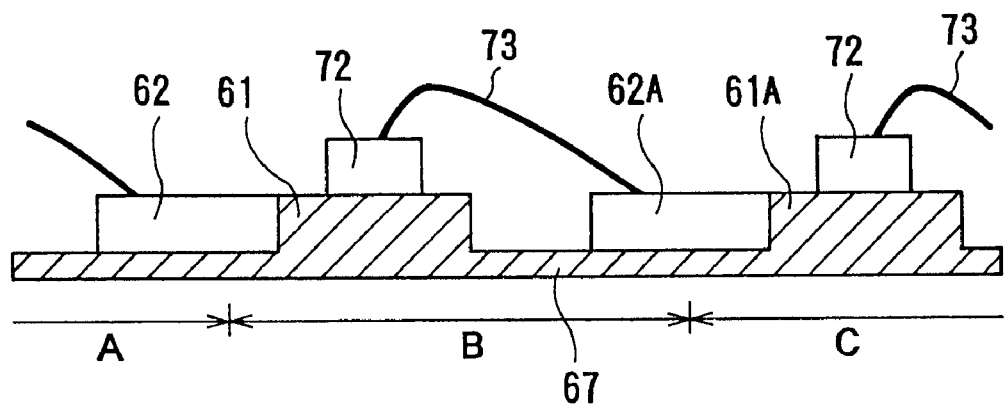
FIG. 10B is a cross-sectional view taken along line XB—XB of FIG. 10A.
Figure 12A:
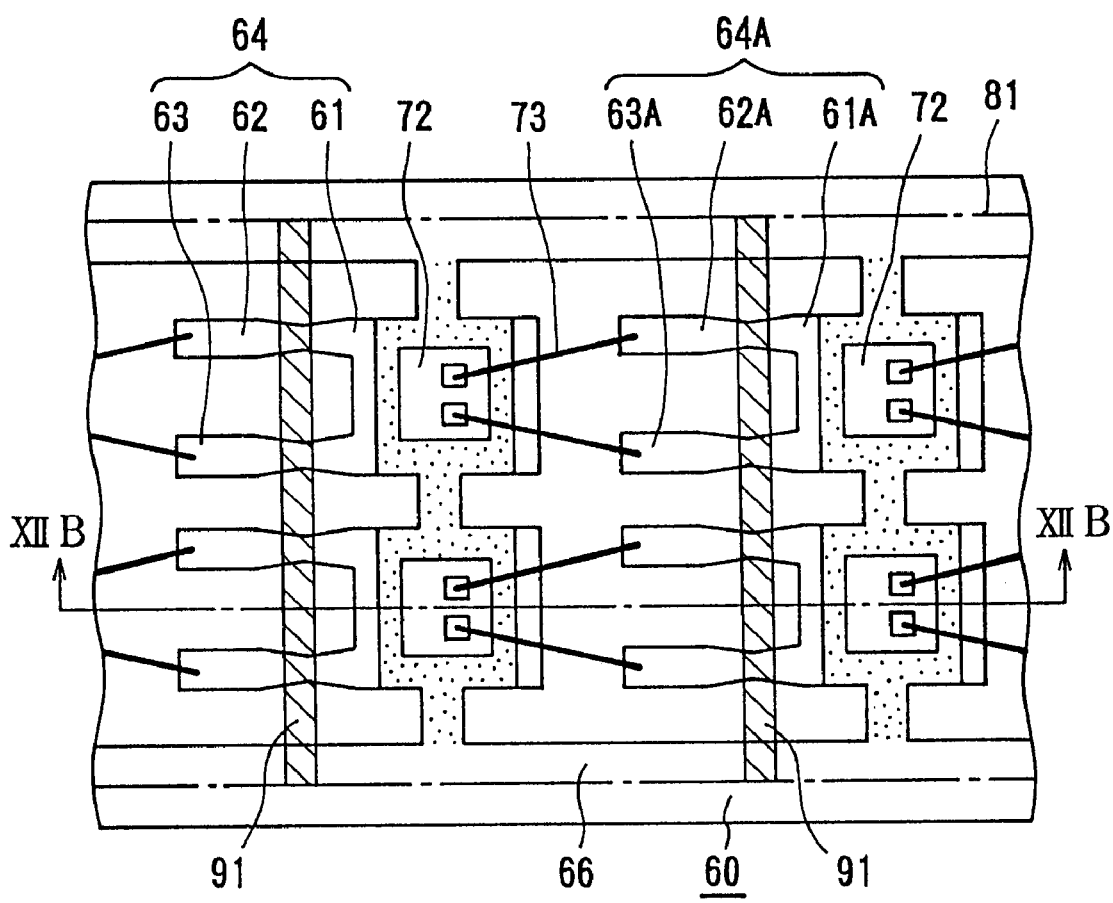
FIG. 12A is a fragmentary plan view of the molded assembly which is slitted.
Figure 12B:
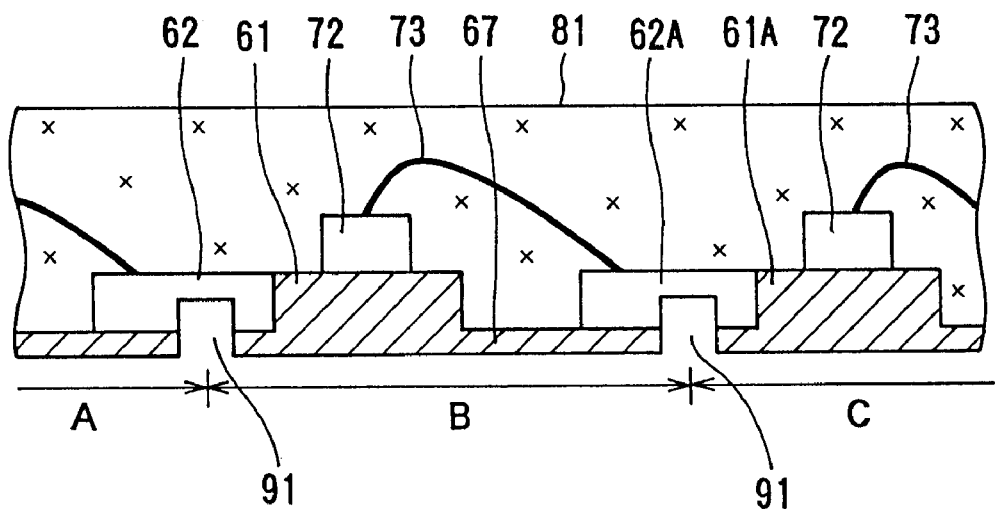
FIG. 12B is a cross-sectional view taken along line XIIB—XIIB of FIG. 12A.
Figure 14:
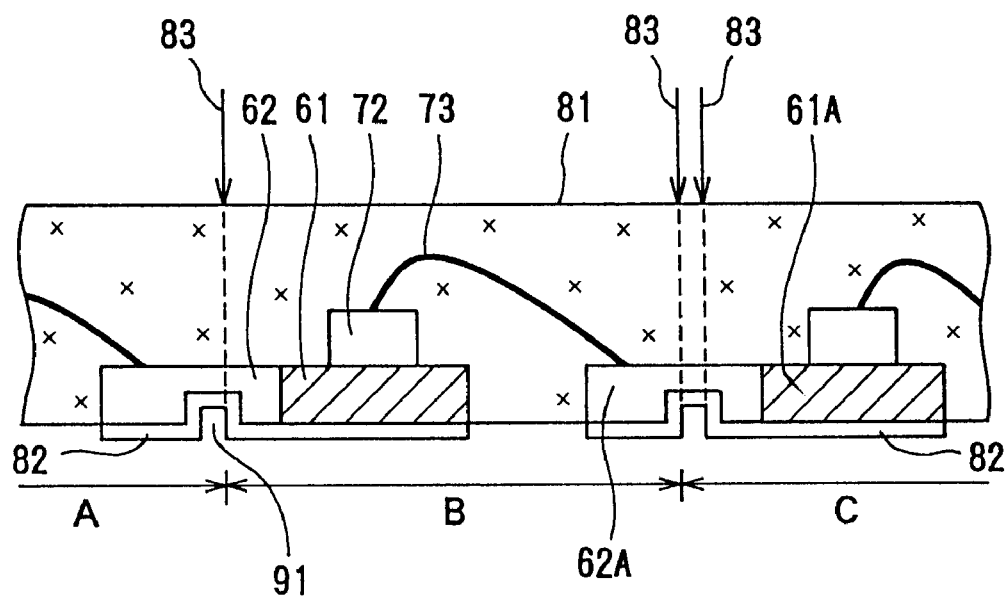
FIG. 14 is a fragmentary cross-sectional view of the molded assembly which is to be severed.

2nd Step (FIGS. 10A and 10B):

Then, the lead frame 60 is processed according to a die bonding process and a wire bonding process. As shown in FIGS. 10A and 10B, an electrically conductive paste 71 such as an Ag paste or a soldering material is coated on primary surfaces of the islands 61, 61A, and semiconductor chips 72 are fixed to the islands 61, 61A by the electrically conductive paste 71. Alternatively, the primary surfaces of the islands 61, 61A may be plated with gold, and the semiconductor chips 72 may be joined to the islands 61, 61A by an eutectic crystal.

Bonding pads on the semiconductor chips 72 are electrically connected to the lead terminals 62, 63 by wires 73 according to a wire bonding process. Each of the wires 73 may comprise a gold wire having a diameter of 20 µm, for example. In FIGS. 10A, and 10B, the wires 73 electrically interconnect surface electrodes of the semiconductor chips 72 and the lead terminals 62A, 63A extending from the island 61A of the adjacent mounting portions 64A.

The reverse or lower surfaces of the islands 61, 61A to which the semiconductor chips 72 are fixed serve as external connection terminals 100, and the leads 62A, 63A, 62, 63 electrically connected to the semiconductor chips 72 by the wires 73 serve as other external connection electrodes 101, 102. Use of the reverse or lower surfaces of the islands 61, 61A as the external connection terminals 100 is suitable for semiconductor devices with vertical current paths, in which the semiconductor chips 72 are transistors, power MOSFETs, etc.

As shown in FIG. 10A, the electrically conductive paste 71 is selectively coated on the islands 61, 61A. If the electrically conductive paste 71 were applied to the islands 62, 63 . . . , then the electrically conductive paste 71 would clog a tip end of the capillary of a bonding apparatus during the wire bonding process, causing a bonding failure and a reduction in the productivity. When there is no danger of such bonding failure, the electrically conductive paste 71 may be coated entirely on the islands 61, 61A.

3rd Step (FIGS. 11A and 11B):

The entire assembly is encased by a molded resin body. Specifically, as shown in FIG. 11A, a resin layer 81 made of a thermosetting resin such as an epoxy resin or the layer 81 made of a thermosetting resin such as an epoxy resin or the like is deposited and molded on the lead frame 60, encasing and protecting the mounting portions 64, 64a, the semiconductor chips 72, and the wires 73. The resin layer 81 does not individually package devices A, B, C, but is deposited entirely over regions where the semiconductor chips 72 are mounted. The lead frame 60 which is encased by the molded resin layer 81 is shown in FIG. 11B.

The resin layer 81 is deposited and molded as follows: A framework (not shown) having a height of several mm is disposed around the lead frame 60, and the space or cavity surrounded by the framework is filled with a thermosetting resin such as an epoxy resin or the like. Then, the thermosetting resin is heated to a temperature ranging from about 150° C. to 200° C. According to an alternative transfer molding process, the lead frame 60 is placed in an injection molding cavity, which is then filled with a thermosetting resin such as an epoxy resin or the like.

4th Step (FIGS. 12A and 12B):

Slits 91 are defined in the reverse side of the lead frame 60. Specifically, the reverse side of the lead frame 60 is cut by a blade of a dicing apparatus to form the slits 91. Each of the slits 91 has a depth which is greater than at least the thickness of the bottom plate 67. One or more slits 91 are defined near each of the constricted central regions of the lead terminals 62, 63, 62A, 63A.

5th Step (FIG. 13A):

As shown in FIG. 13A, the reverse side of the lead frame 60 is mechanically or chemically scraped off to remove the bottom plate 67. Since the thickness of the bottom plate 67 is relatively small, it can easily be removed when the reverse side of the lead frame 60 is scraped off as by buffing or the like. After the bottom plate 67 is removed, the islands 61, 61A and the lead terminals 62, 63, 62A, 63A are exposed on the reverse side of the lead frame 60.

6th Step (FIG. 13B):

Thereafter, as shown in FIG. 13B, plated layers 82 such as of a soldering material are deposited on the islands 61, 61A and the lead terminals 62, 63, 62A, 63A and the surfaces of the slits 91 which are exposed on the reverse side of the lead frame 60. The plated layers 82 are deposited by an electroplating process with the lead frame 60 used as an electrode. Since the slits 91 do not extend fully across the lead terminals 62, 63, 62A, 63A, the islands 61, 61A are electrically connected to the lead terminals 62, 63, 62A, 63A, and the mounting portions 64, 64A are electrically connected by the joint bars 65, 65A. Since all the exposed metal surfaces are electrically connected together, the plated layer 82 can be deposited in one plating operation.

7th Step (FIG. 14):

The resin layer 82 is severed into the devices A, B, C. Specifically, a region (indicated by arrows 83 in FIG. 14 or a dot-and-dash line 83 in FIG. 10A) which includes the island 61 with the semiconductor chip 72 fixed thereto and the lead terminals 62A, 63A electrically connected to the semiconductor chip 72 is cut off from the resin layer 82, thereby producing the semiconductor device shown in FIGS.

7A–7C and 8A, 8B. The semiconductor device is cut off by a dicing apparatus. The resin layer 81 and the lead frame 60 are simultaneously severed by the dicing blade of the dicing apparatus. Specifically, a blue sheet, e.g., "UV sheet" manufactured by Lintech Co., is applied to the reverse side of the lead frame 60, and the resin layer 81 and the lead frame 60 are simultaneously severed by the dicing blade which cuts into the assembly until it reaches the surface of the blue sheet. In the slits 91, the plated layers 82 remain attached to the surfaces of the slits 91. The remaining plated layers 82 will be used when the semiconductor device is mounted on a printed-circuit board. The cut ends of the lead terminals 62, 63 serve as the projecting teeth 61a (see FIG. 7B), and the cut ends of the joint bars 65 serve as the projecting teeth 61b. These cut ends of the lead terminals 62, 63 and the joint bars 65 lie flush with and are exposed on cut side surfaces of the resin layer 81.

The semiconductor device thus fabricated by the above manufacturing process offers the following advantages:

Since the plated layers 82 are disposed on the external connection terminals 100, 101, 102 of the semiconductor device, when the semiconductor device is soldered to a packaging board, the applied solder easily rises up to the upper ends of the plated layers 82, which were positioned on the inner surfaces of the slits 91, providing an increased solder bonding strength for protection against a deterioration due to stresses such as thermal stresses.

Figure 8A:
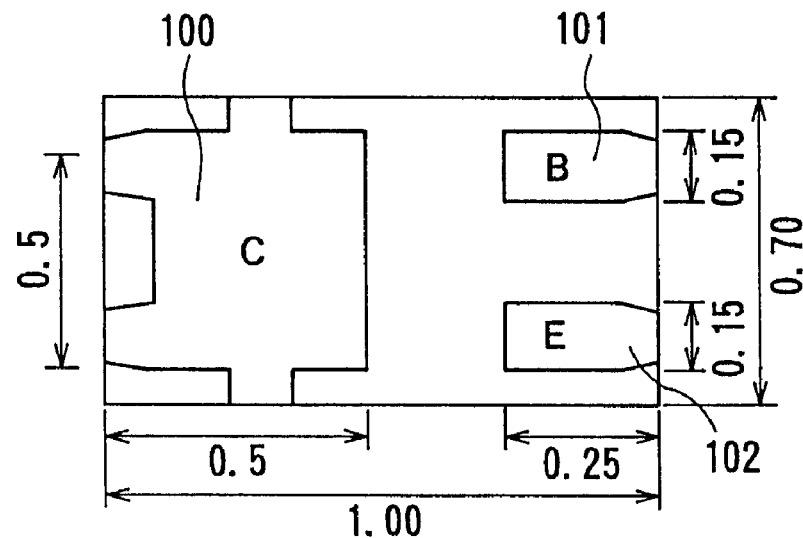
FIG. 8A is a bottom view of the semiconductor device shown in FIG. 7A.
Figure 8B:
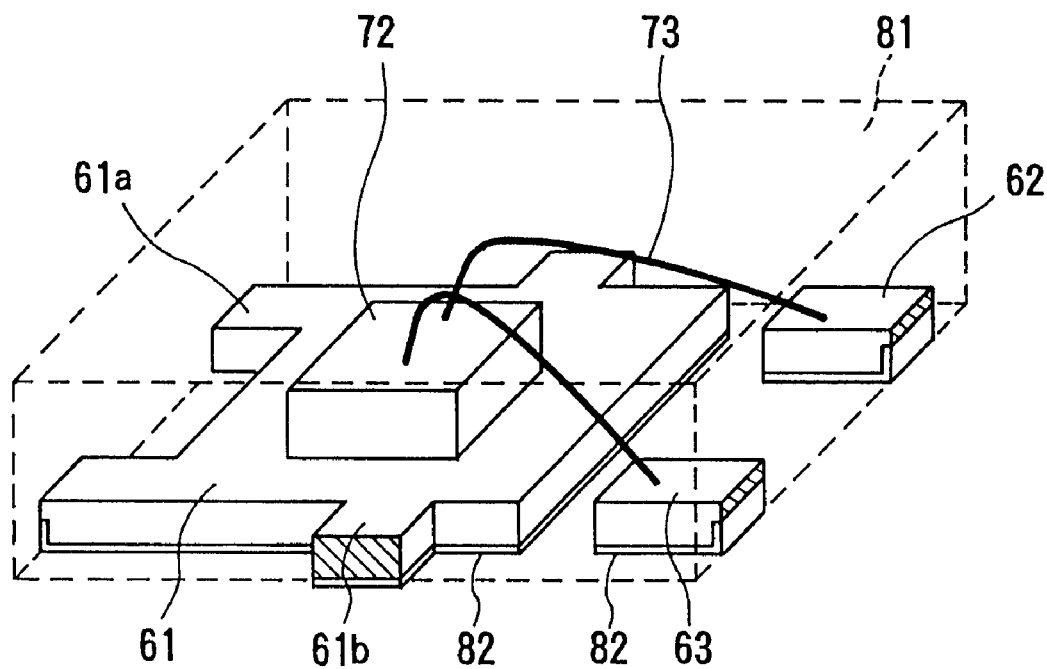
FIG. 8B is a schematic perspective view of the semiconductor device shown in FIG. 7A.

The terminal ends of the external connection terminals 100, 101, 102 are tapered at the opposite ends of the semiconductor device, as shown in FIG. 8A. Consequently, the external connection terminals 100, 101, 102 are effectively prevented from being dislodged from the corresponding sides of the resin layer 81.

The inventor conducted an experiment in which a transistor chip having a chip size of 0.40 mm×0.40 mm was placed on an island 61, and a semiconductor device (see FIG. 7A) having a package size of 1.0 mm×0.7 mm was manufactured according to the process described above. An external connection terminal 100 produced from the island 61 had a size of 0.6 mm×0.6 mm, and each of external connection terminals 101, 102 produced from the lead terminals 62, 63 had a size of 0.25 mm×0.15 mm. The sizes of the external connection terminals 100, 101, 102 and the size of the semiconductor device itself may be set to arbitrary values depending on the size of the semiconductor chip.

Figure 3:
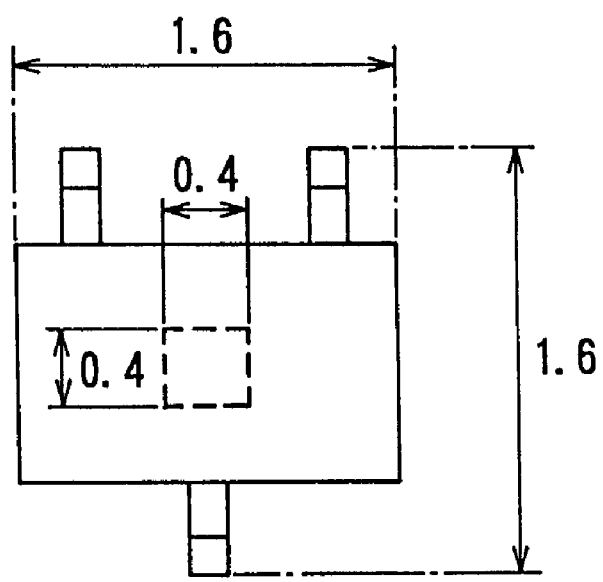
FIG. 3 is a plan view of still another conventional semiconductor device.
Figure 4:
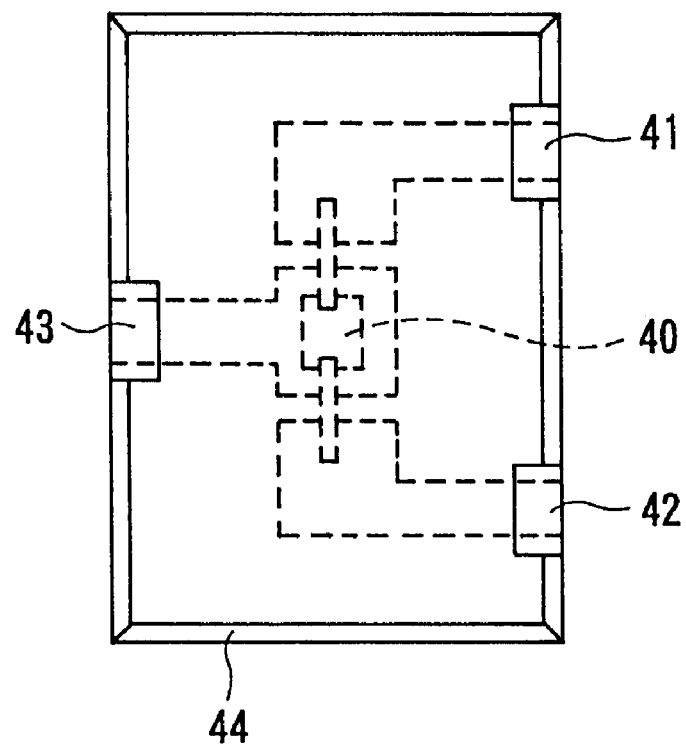
FIG. 4 is a plan view of yet still another conventional semiconductor device.
Figure 5:
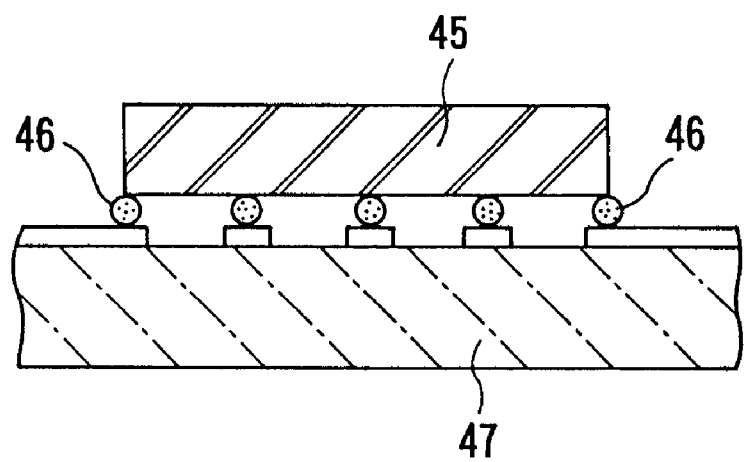
FIG. 5 is a cross-sectional view of another conventional semiconductor device mounted on a packaging board.
Figure 6:
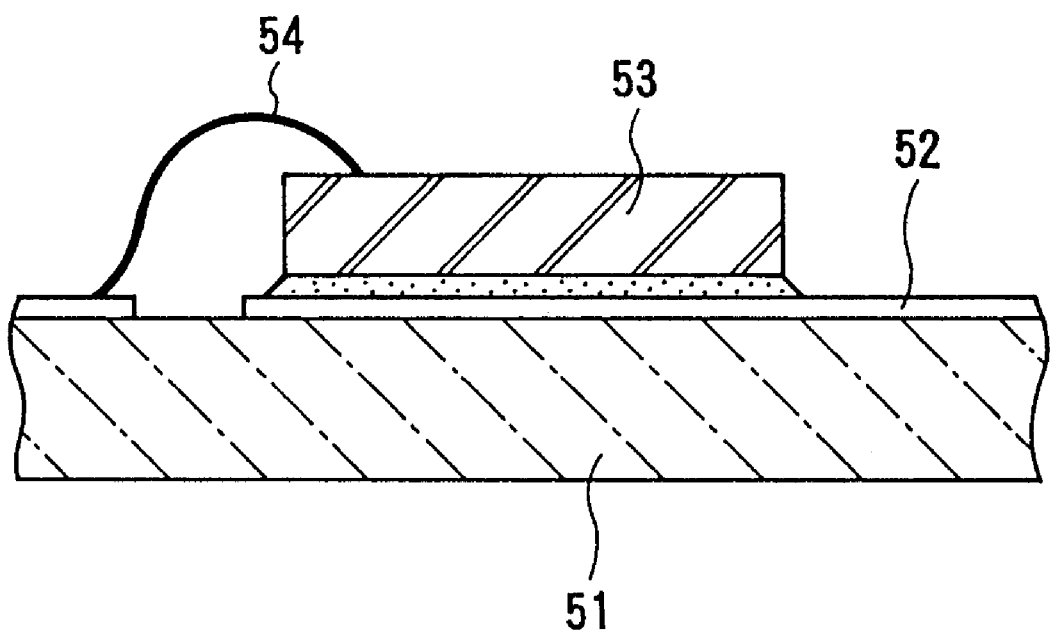
FIG. 6 is a cross-sectional view of still another conventional semiconductor device mounted on a packaging board.
Figure 7A:
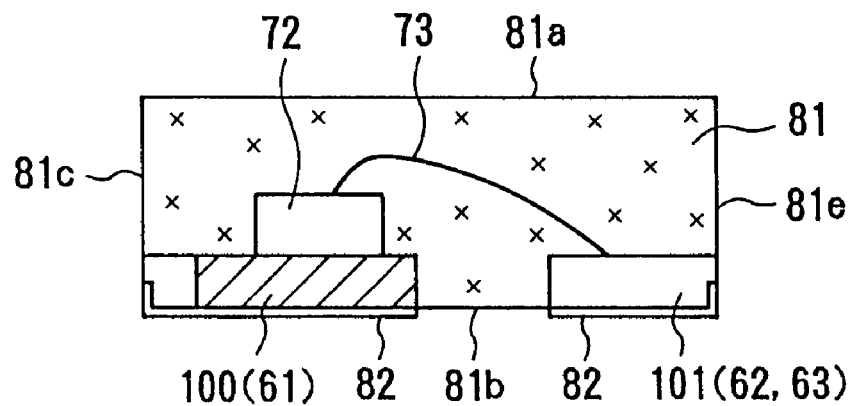
FIG. 7A is a cross-sectional view of a semiconductor device according to the present invention.
Figure 7B:
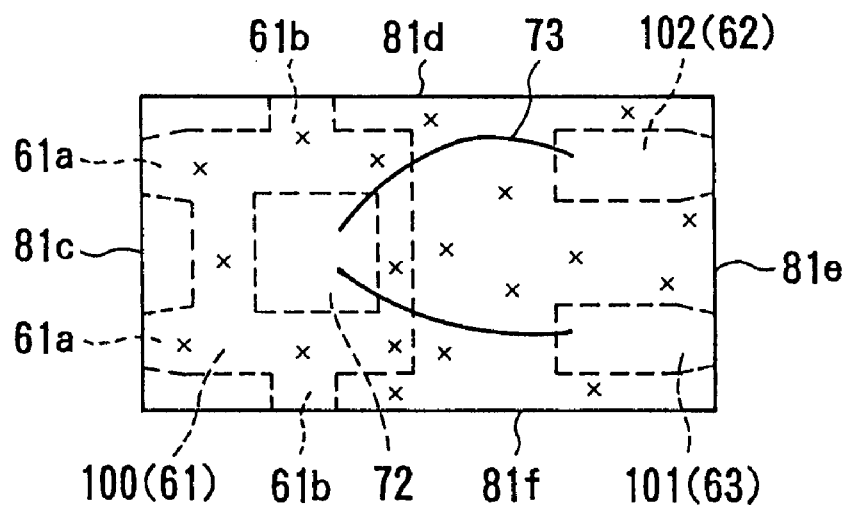
FIG. 7B is a plan view of the semiconductor device shown in FIG. 7A.
Figure 7C:
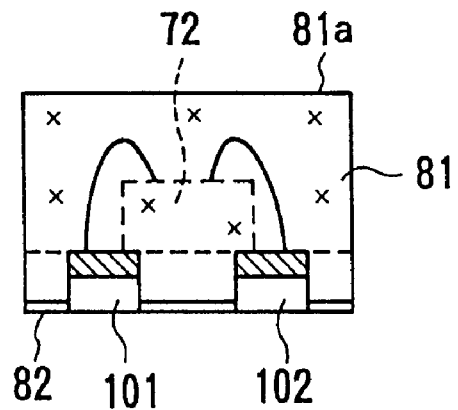
FIG. 7C is a side elevational view of the semiconductor device shown in FIG. 7A.

A comparison of the effective area percentage of the semiconductor device manufactured according to the above process, and the effective area percentage of the conventional semiconductor device shown in FIG. 3 will be described below.

The conventional semiconductor device had a chip size of 0.40 mm×0.40 mm. When the semiconductor chip of the conventional semiconductor device was connected to metal lead terminals by wires and encased by a molded resin body, the semiconductor device had an overall size of 1.6 mm×1.6 mm. The semiconductor device had an area of 2.56 mm$^2$, and the semiconductor chip had an area of 0.16 mm$^2$. The mount area in which the conventional semiconductor device was mounted was 2.56 mm$^2$ as it was essentially the same as the area of the semiconductor device, and hence the effective area percentage of the conventional semiconductor device was about 6.25%.

While the semiconductor device according to the present invention has a chip size of 0.40 mm×0.40 mm, as described above, since no metal lead terminals project from the package, the semiconductor device may have a size of 1.0 mm×0.7 mm, and hence an area of 0.7 mm$^2$. Consequently, the effective area percentage of the semiconductor device is 22.85%, which is about 3.6 times greater than the effective area percentage of the conventional semiconductor device. Accordingly, the mount area in which the semiconductor device according to the present invention is mounted on a packaging board contains a smaller dead space, and hence the packaging board may be reduced in size.

Since a number of semiconductor devices are packaged together on the packaging board, any amount of material waste is much smaller than it would be if semiconductor devices were packaged individually, resulting in a reduction in the cost of materials used.

Furthermore, inasmuch as the outer contour of the semiconductor device is defined by the dicing blade, the outer contour of the resin layer 81 may be defined highly accurately with respect to the pattern of the lead frame 60 by forming positioning marks on the outer strips 66 of the lead frame 60 and dicing the assembly with the dicing blade in alignment with the positioning marks. Specifically, whereas the lead frame and the mold cavity according to the transfer molding process can be positioned relatively to each other with an accuracy limit of ±50 μm, the accuracy limit that can be achieved when the outer contour of the resin layer 81 is defined by the dicing blade is reduced to about ±10 μm. The reduced accuracy limit allows the area of the island 60 to be increased, thereby increasing the area of the semiconductor chip 72 that can be mounted.

Figure 15:
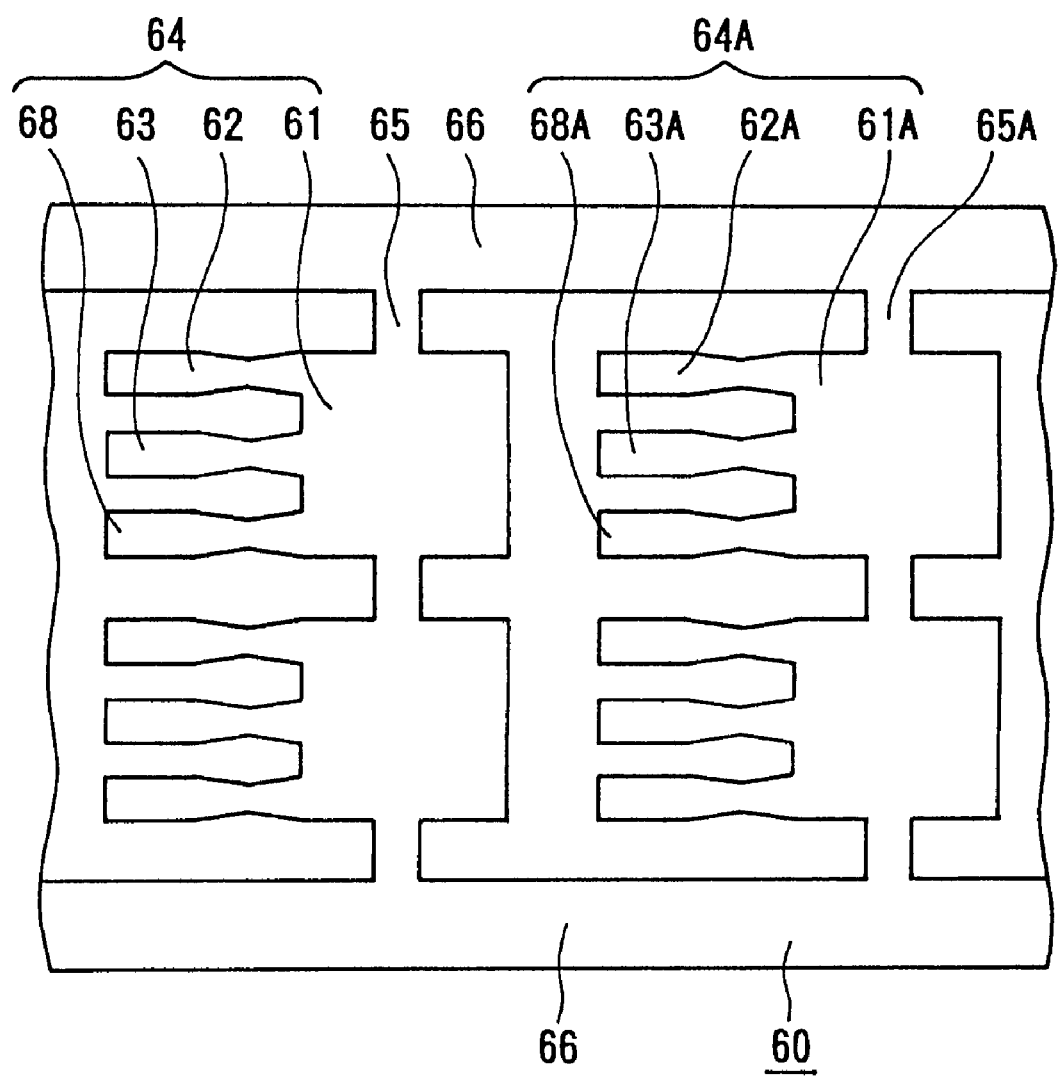
FIG. 15 is a fragmentary plan view of a lead frame used in a process of manufacturing a semiconductor device according to another embodiment of the present invention.

In the above embodiment, the lead frame 60 is of such a structure as to produce three-terminal semiconductor devices. FIG. 15 shows a lead frame used in a process of manufacturing a semiconductor device according to another embodiment of the present invention. In FIG. 15, the lead frame has a plurality of mounting portions 64 (64A) each having an island 61 (61A) and three lead terminals 62, 63, 68 (62A, 63A, 68A) extending therefrom. The lead frame shown in FIG. 15 serves to produce four-terminal semiconductor devices.

In the illustrated embodiments, a single semiconductor chip is mounted on each island. However, a plurality of transistors may be mounted on an island, or transistors and other devices such as vertical power MOSFETs or the like may be combined and mounted on islands. For such applications, lead frames having many lead terminals as shown in FIG. 15 are employed.

While a transistor is used as the semiconductor chip 72 in the illustrated embodiments, a vertical device or a horizontal device with relatively small heat dissipation, such as a power MOSFET, an IGBT, HBT, etc., may be used as the semiconductor chip 72. Furthermore, the present invention is also applicable to an integrated circuit such as a BIP- or MOS-type integrated circuit if the number of lead terminals is increased.

Although certain preferred embodiments of the present invention have been shown and described in detail, it should be understood that various changes and modifications may be made therein without departing from the scope of the appended claims.

We claim:
1. A method of manufacturing a semiconductor device, comprising:
   providing a lead frame including an array of mounting portions connected by joint bars, each of the mounting portions having an island for mounting a semiconductor chip thereon and having a plurality of lead terminals extending from the island, wherein the lead terminals comprise external connection terminals for forming an electrical connection to another semiconductor chip mounted on an adjacent island along the array of mounting portions;

mounting a semiconductor chip on a first surface of the island;

electrically connecting the semiconductor chip to the lead terminals extending from an adjacent island along the array;

forming a resin layer so as to cover the semiconductor chip, the first surface of the island, and first surfaces of the lead terminals, wherein a second surface of the island opposite the first surface of the island and second surfaces of the lead terminals opposite the first surfaces of the lead terminals are free of the resin layer so as to be exposed; and separating the lead frame so as to form a package including a region surrounding the island and the lead terminals electrically connected to the semiconductor chip mounted on the island.

2. The method of claim 1, wherein said providing of the lead frame comprises providing a lead frame having a bottom plate lower than the island and the lead terminals, and having a surface contiguous to the second surface of the island and contiguous to the second surfaces of the lead terminals; and further comprising removing the bottom plate after said forming of the resin layer.

3. The method of claim 2, further comprising half-cutting the lead frame after said forming of the resin layer so as to form slits in and across the lead terminals from opposite surfaces of the lead terminals.

4. The method of claim 3, further comprising forming a plated layer on the second surface of the island, the second surfaces of the lead terminals and inner surfaces of the slits after said removing of the bottom plate.

5. The method of claim 1, further comprising half-cutting the lead frame after said forming of the resin layer so as to form slits in and across the lead terminals from opposite surfaces of the lead terminals.

6. A method of manufacturing a semiconductor device, comprising:

providing a lead frame having an array of mounting portions on a first surface of the lead frame and having a common back plate on a second surface of the lead frame, wherein the first surface is opposite the second surface, each of the mounting portions having an island for mounting a semiconductor chip thereon and having a plurality of lead terminals extending from the island, wherein the lead terminals comprise external connection terminals for forming an electrical connection to another semiconductor chip mounted on an adjacent island along the array by wiring;

mounting a semiconductor chip on a first surface of the island of each of the mounting portions;

electrically connecting the semiconductor chip by wiring the semiconductor chip to the lead terminals extending from an adjacent island along the array;

forming a resin layer so as to cover the semiconductor chip, the first surface of the island, and first surfaces of the lead terminals;

removing the back plate from the second surface of the lead frame; and separating the lead frame so as to form a package including a region surrounding the island and the lead terminals electrically connected to the semiconductor chip mounted on the island.

7. The method of claim 6, wherein said providing of the lead frame comprises forming the lead frame from a thin metal sheet having a uniform thickness and a first surface, said forming comprising selective etching so as to form the array of mounting portions on the common back plate by half-etching from the first surface of the metal sheet.

8. The method of claim 6, wherein said providing of the lead frame comprises forming the lead frame from a first metal sheet and a second metal sheet bonded together, wherein the first metal sheet includes an array of mounting portions and the second metal sheet comprises a back plate having a uniform thickness.

* * * * *